United States Patent
Hu et al.

(10) Patent No.: US 9,831,217 B2
(45) Date of Patent: Nov. 28, 2017

(54) METHOD OF FABRICATING PACKAGE SUBSTRATES

(71) Applicant: PHOENIX PIONEER TECHNOLOGY CO., LTD., Hsinchu County (TW)

(72) Inventors: Chu-Chin Hu, Hsinchu County (TW); Shih-Ping Hsu, Hsinchu County (TW); Che-Wei Hsu, Hsinchu County (TW); Chin-Ming Liu, Hsinchu County (TW); Chih-Kuai Yang, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 0 days.

(21) Appl. No.: 15/465,775

(22) Filed: Mar. 22, 2017

(65) Prior Publication Data

US 2017/0301652 A1    Oct. 19, 2017

(30) Foreign Application Priority Data

Apr. 15, 2016   (TW) .............................. 105111841 A

(51) Int. Cl.
*H01L 25/065*     (2006.01)
*H01L 21/683*     (2006.01)
(Continued)

(52) U.S. Cl.
CPC ...... *H01L 25/0657* (2013.01); *H01L 21/4832* (2013.01); *H01L 21/4857* (2013.01);
(Continued)

(58) Field of Classification Search
CPC ............. H01L 25/0657; H01L 25/0652; H01L 25/0655; H01L 25/18; H01L 25/50;
(Continued)

(56) References Cited

U.S. PATENT DOCUMENTS 6,919,226 B2 *   7/2005   Ogawa ................. H01L 21/6835
                                                        257/E21.503
8,039,304 B2 *  10/2011   Pagaila ................. H01L 21/561
                                                        257/E21.705
(Continued)

*Primary Examiner* — Michael Trinh
(74) *Attorney, Agent, or Firm* — WPAT, PC

(57) ABSTRACT

This disclosure provides a package substrate fabrication method including: forming a first conductive wire and a first connecting unit on a first carrier substrate; forming a first dielectric layer on the first carrier substrate while enabling an end face of the first connecting unit to be exposed; bonding a second carrier substrate to the first dielectric layer and removing the first carrier substrate; disposing a first circuit chip and a second connecting unit on the first conductive wire; forming a second dielectric layer on the second carrier substrate while enabling the first circuit chip and the second connecting unit to be surrounded by the second dielectric layer and an end face of the second connecting unit to be exposed; forming a second conductive wire on the second dielectric layer; disposing a second circuit chip on the second conductive wire; and forming a third dielectric layer on the second carrier substrate.

10 Claims, 4 Drawing Sheets

(51) Int. Cl.
*H01L 21/48* (2006.01)
*H01L 25/00* (2006.01)
*H01L 21/56* (2006.01)
*H01L 23/00* (2006.01)
*H01L 23/538* (2006.01)
*H01L 25/18* (2006.01)

(52) U.S. Cl.
CPC ............ *H01L 21/56* (2013.01); *H01L 21/563* (2013.01); *H01L 21/566* (2013.01); *H01L 21/568* (2013.01); *H01L 21/6835* (2013.01); *H01L 23/5389* (2013.01); *H01L 24/81* (2013.01); *H01L 25/18* (2013.01); *H01L 25/50* (2013.01); *H01L 2221/68345* (2013.01); *H01L 2221/68359* (2013.01); *H01L 2224/08238* (2013.01); *H01L 2224/81005* (2013.01); *H01L 2224/81192* (2013.01); *H01L 2225/06517* (2013.01); *H01L 2225/06548* (2013.01); *H01L 2225/06582* (2013.01); *H01L 2924/1433* (2013.01); *H01L 2924/1434* (2013.01)

(58) Field of Classification Search
CPC ..... H01L 23/5389; H01L 24/81; H01L 21/56; H01L 21/563; H01L 21/568; H01L 21/4832; H01L 21/566; H01L 2225/06517; H01L 2225/06548; H01L 2224/68345; H01L 2224/81005; H01L 2224/81192

See application file for complete search history.

(56) References Cited

U.S. PATENT DOCUMENTS

| | | | |
|---|---|---|---|
| 8,889,484 B2* | 11/2014 | Chen | H01L 24/19 438/106 |
| 2013/0105989 A1* | 5/2013 | Pagaila | H01L 21/56 257/774 |
| 2015/0255447 A1* | 9/2015 | Hung | H01L 23/481 257/774 |
| 2015/0279818 A1* | 10/2015 | Hsu | H01L 24/19 257/737 |
| 2016/0233196 A1* | 8/2016 | Kim | H01L 25/0657 |

* cited by examiner
METHOD OF FABRICATING PACKAGE SUBSTRATES

CROSS REFERENCE TO RELATED APPLICATION

This application claims the benefit of Taiwan application Serial No. 105111841, filed on Apr. 15, 2016, the disclosure of which is incorporated by reference herein in its entirety.

FIELD OF THE INVENTION

The present invention relates to a method of fabricating package substrates and, more particularly, to a method of fabricating a number of package substrates concurrently which are processed on a single original substrate or carrier substrate by the so-called "panel-level" or "wafer-level" packaging technology.

BACKGROUND OF THE INVENTION

As recent rapid trend in modern electronic devices is not only toward lighter and smaller devices, but also toward multi-function and high-performance devices, the integrated-circuit (IC) fabrication and technology has to evolve correspondingly toward a more high-density and miniature design so as to allow more electronic components to be received inside limited chip space. Consequently, the relating IC package substrate and the package technology are evolved accordingly to meet the trend.

The "Semiconductor embedded in substrate" technology embedding a semiconductor die in a package substrate is a promising packaging technology because such kind of package substrate has the advantages of a miniaturized size and a reduced disturbance from outside noise. However, its fabrication cost is still comparatively high and, therefore, it is in need of a new and advanced packaging solution to reduce the fabrication cost.

SUMMARY OF THE INVENTION

According to one aspect of the present disclosure, one embodiment provides a method for fabricating a package substrate which includes: (A) providing a first carrier substrate; (B) forming a first conductive wire and a first connecting unit on the first carrier substrate; (C) forming a first dielectric layer on the first carrier substrate while enabling the first conductive wire and the first connecting unit to be surrounded by the first dielectric layer and an end face of the first connecting unit to be exposed; (D) bonding a second carrier substrate to the first dielectric layer and then removing the first carrier substrate; (E) disposing a first circuit chip and a second connecting unit on the first conductive wire; (F) forming a second dielectric layer on the second carrier substrate while enabling the first circuit chip and the second connecting unit to be surrounded by the second dielectric layer and an end face of the second connecting unit to be exposed; (G) forming a second conductive wire on the second dielectric layer; (H) disposing a second circuit chip on the second conductive wire; (I) forming a third dielectric layer on the second carrier substrate; and (J) removing the second carrier substrate.

In one embodiment, the step (B) includes: (B11) forming the first conductive wire on the first carrier substrate; and (B12) forming the first connecting unit on the first conductive wire.

In one embodiment, the step (C) includes: (C11) forming the first dielectric layer on the first carrier substrate while enabling the first conductive wire and the first connecting unit to be covered by the first dielectric layer; and (C12) partly removing the first dielectric layer to expose the end face of the first connecting unit.

In one embodiment, either the first circuit chip is disposed before the second connecting unit or the second connecting unit is disposed before the first circuit chip in the step (E).

In one embodiment, the first circuit chip and the second connecting unit are not vertically overlapped in the step (E).

In one embodiment, the second connecting unit includes a metal pillar.

In one embodiment, the second connecting unit is formed by electrolytic plating.

In one embodiment, the step (F) includes: (F11) forming the second dielectric layer on the second carrier substrate while enabling the first circuit chip and the second connecting unit to be covered by the second dielectric layer; and (F12) partly removing the second dielectric layer to expose the end face of the second connecting unit.

In one embodiment, the second conductive wire is formed on the second dielectric layer while enabling the second conductive wire to be in contact with the exposed end face of the second connecting unit in the step (G).

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

In the following embodiments of the present disclosure, when an element is described to be disposed above/mounted on top of or below/under another element, it comprises either the element is directly or indirectly disposed above/below the other element, i.e. when indirectly, there can be some other element arranged between the two; and when directly, there is no other element disposed between the two. It is noted that the descriptions in the present disclosure relate to "above" or "below" are based upon the related diagrams provided, but are not limited thereby. Moreover, the terms "first", "second", and "third", and so on, are simply used for clearly identifying different elements of the same nature, but those elements are not restricted thereby and must be positioned or arranged accordingly. In addition, the size or thickness of each and every element provided in the following diagrams of the present disclosure is only schematic representation used for illustration and may not represent its actual size.

Figure 1:
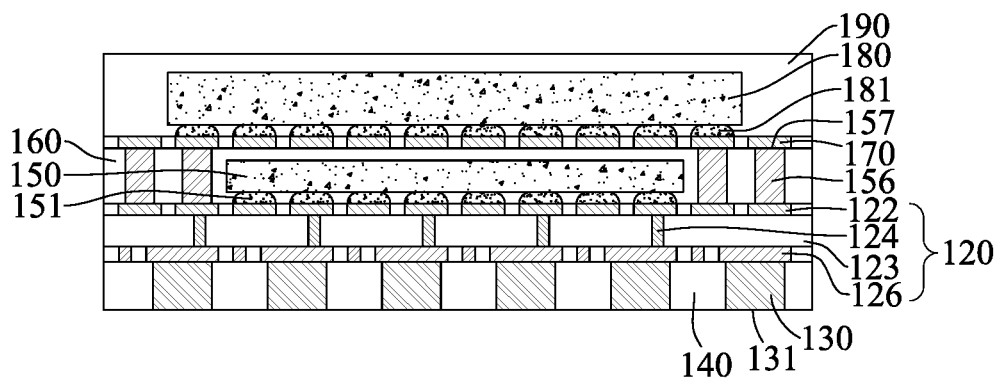
FIG. 1 shows a cross-sectional view of a package substrate according to one embodiment of the present invention.

FIG. 1 shows a cross-sectional view of a package substrate 100 according to one embodiment of the present invention. The package substrate 100 comprises: a first conductive wire layer 120, a first connecting unit 130, a first dielectric layer 140, a first circuit chip 150, a second connecting unit 156, a second dielectric layer 160, a second conductive wire layer 170, a second circuit chip 180 and a third dielectric layer 190. As shown in FIG. 1, the combination of the first conductive wire layer 120, the first circuit chip 150 and the second dielectric layer 160 can be regarded as a first package unit, while the second conductive wire layer 170, the second circuit chip 180 and the third dielectric layer 190 can be regarded as a second package unit. The second package unit is stacked on the first package unit, and thus the package substrate 100 can be classified as a so-called Package-on-Package (PoP) substrate in the field of art, which includes at least two package units stacked to be a package substrate of multi-layered structure.

The first conductive wire layer 120 represents the predefined circuitry layout of the package substrate 100, which can be of single layer or multi-layered structure. In the embodiment, the first conductive wire layer 120 has a multi-layered structure including: a first sub-wire 122, a connecting sub-unit 124, and a second sub-wire 126 in a fourth dielectric layer 123, as shown in FIG. 1. The first sub-wire 122 and the second sub-wire 126 represent upper-layer and lower-layer circuits of the first conductive wire layer 120, respectively, and the connecting sub-unit 124 is used to connect the first sub-wire 122 with the second sub-wire 126. To form the first sub-wire 122 and the second sub-wire 126, a metal layer can be formed of Cu, Al, Ni, or their combination by electrolytic plating or evaporation, and then patterned by means of photolithography. The connecting sub-unit 124 is formed with at least one metal pillar, e.g. copper pillar, which passes through the fourth dielectric layer 123 to connect the first sub-wire 122 (the upper-layer circuit of the first conductive wire layer 120) with the second sub-wire 126 (the lower-layer circuit of the first conductive wire layer 120).

As recited above, the first conductive wire layer 120, the first circuit chip 150 and the second dielectric layer 160 can be combined to be a first package unit, and the second conductive wire layer 170, the second circuit chip 180 and the third dielectric layer 190 can be combined to be a second package unit. Each of the first circuit chip 150 and the second circuit chip 180 may be an active or passive circuit device, which is a die diced from a semiconductor wafer following the IC fabrication process. In the embodiment, the die is provided with connection terminals 151 and 181 in the form of pin, pad or solder bump. In the embodiment, the first circuit chip 150 is an ASIC (Application-Specific Integrated Circuit) like a micro-processor, and the second circuit chip 180 is a memory chip. In addition, the above-recited first package unit may further include the second connecting unit 156 formed with at least one metal pillar, e.g. copper pillar, which passes through the second dielectric layer 160 to connect the first conductive wire layer 120 with the second conductive wire layer 170. That is to say, the second connecting unit 156 is used to connect the first package unit with the second package unit. The second conductive wire layer 170 represents the predefined circuitry layout of the second package unit, which can be of single layer or multi-layered structure. In the embodiment, the second conductive wire layer 170 constructs a single-layer circuit and can be formed by electrolytic plating or evaporating a metal layer of Cu, Al, Ni, or their combination, and then patterning it by means of photolithography.

The first connecting unit 130, located at the bottom of the package substrate 100 as shown in FIG. 1, is used to connect the package substrate 100 to an external circuit. For example, solder balls can be formed under the first connecting unit 130, so as to bond the package substrate 100 to a printed-circuit board. The first connecting unit 130 may be formed with at least one metal pillar, e.g. Cu pillar, which passes through the first dielectric layer 140 to connect the first conductive wire layer 120 with the external circuit.

The first dielectric layer 140, the second dielectric layer 160, the third dielectric layer 190 and the fourth dielectric layer 123 can be formed of a dielectric material selected from the group consisting of novolac-based resin, epoxy-based resin and silicon-based resin by a molding means like compression molding. But it is not limited thereto, the underfill material with stronger capillarity but more cost can be used to form the second dielectric layer 160 and the third dielectric layer 190, so that the small spaces between the first circuit chip 150 and the first conductive wire layer 120 as well as the second circuit chip 180 and the second conductive wire layer 170 can be well filled up. The second dielectric layer 160 covers the first circuit chip 150 and fills up the remainder space of the first package unit other than the first circuit chip 150 and the second connecting unit 156, so that the first package unit is provided with a firm structure. The third dielectric layer 190 covers the second circuit chip 180 and fills up the remainder space of the second package unit other than the second circuit chip 180, so that the second package unit is also provided with a firm structure. The first dielectric layer 140, the second dielectric layer 160, the third dielectric layer 190 and the fourth dielectric layer 123 can be formed of the same or different dielectric materials. Moreover, the part of the third dielectric layer 190 over the top surface of the second circuit chip 180 may act as a protective layer to protect the package substrate 100 from any adverse affect of its surrounding environment or posterior processes such as soldering.

Figure 2:
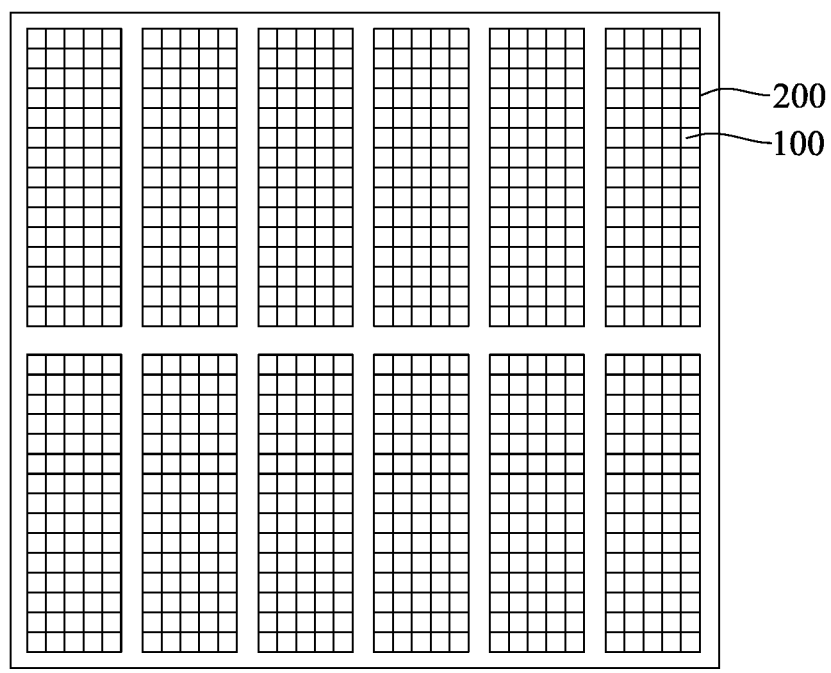
FIG. 2 shows a top view of a wafer-level packaging panel with 900 package substrates as an example.

In the embodiments, the manufacturing process of the package substrate 100 is based on the wafer-level or panel-level packaging technology. That is, a group of package substrates 100 are arranged in a matrix form on a wafer and its carrier substrate, so that a large number of package substrates 100 can be concurrently fabricated in the whole process and the wafer is then sliced into individual package substrates 100 as shown in FIG. 1. The manufacturing process is named as a "wafer-level" or "panel-level" packaging technology because the package substrates 100 are concurrently fabricated on a single wafer or panel substrate in the whole process. FIG. 2 shows a top view of a wafer-level packaging panel 300 with 900 package substrates 100 as an example. Wherein, 75 package substrate 100 are arranged in a 15×5 matrix to form a sub-panel 200, and 12 sub-panels 200 are arranged in a 2×6 matrix to form the whole panel 300.

The fabrication process will be described in detail in the following paragraphs. Wherein, FIG. 3-9 are cross-sectional views of the package substrate 100 according to the embodiment of FIG. 1 in the present disclosure, corresponding to different process steps.

At first, a first carrier 110 is provided to carry and support electronic components and conductive wires of the package substrate 100. The first carrier 110 can be a metal substrate plate or a dielectric substrate plate coated with a metal layer in a wafer-level or panel-level size, in which the metal can be Fe, Cu, Ni, Sn, Al, Ni/Au or their combination.

Figure 3:
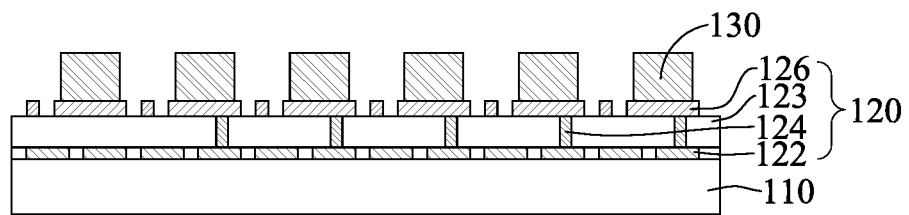
FIG. 3-9 are cross-sectional views of the package substrate according to the embodiment in the present disclosure, corresponding to different process steps.

Next, a first conductive wire layer 120 is formed on the first carrier 110 and a first connecting unit 130 is then formed on the first conductive wire layer 120, as shown in FIG. 3. The first conductive wire layer 120 may be of single layer or multi-layered structure and include at least one metal wire, to be main circuitry layout of the package substrate 100. In the embodiment, the first conductive wire layer 120 has a multi-layered structure including: a first sub-wire 122 formed on the first carrier 110, a connecting sub-unit 124 formed on the first sub-wire 122, a second sub-wire 126 formed on the connecting sub-unit 124, and a fourth dielectric layer 123 occupying or filling up the remainder part of the first conductive wire layer 120. The first sub-wire 122 and the second sub-wire 126 represent upper-layer and lower-layer circuits of the first conductive wire layer 120, respectively, and the connecting sub-unit 124 is used to connect the first sub-wire 122 with the second sub-wire 126. To form the first sub-wire 122 and the second sub-wire 126, a metal layer can be formed of Cu, Al, Ni, or their combination by electrolytic plating or evaporation, and then patterned by means of photolithography. The connecting sub-unit 124 is formed with at least one metal pillar, e.g. copper pillar, which passes through the fourth dielectric layer 123 to connect the first sub-wire 122 (the upper-layer circuit of the first conductive wire layer 120) with the second sub-wire 126 (the lower-layer circuit of the first conductive wire layer 120).

For example, a photoresist layer can be deposited on the first carrier 110 by laminating or spin-coating, and then patterned by exposure to light and developing. By electrolytic plating, a metal layer can be deposited on the first carrier 110 except the region covered by the patterned photoresist layer; thus, the metal wires are formed on the first carrier 110. Alternatively, the first conductive wire layer 120 can be formed by laser engraving. For example, a dielectric layer can be deposited on the first carrier 110 and then patterned by laser engraving. By evaporating or sputtering, a metal layer can be deposited on the first carrier 110 and the patterned dielectric layer. By using the lift-off processing, the patterned dielectric layer can be washed out together with the part of the metal layer directly on its top surface, and the remainder of the metal layer not on the patterned dielectric layer stays on the first carrier 110 to be the metal wires. The fourth dielectric layer 123 can be formed of a dielectric material selected from the group consisting of novolac-based resin, epoxy-based resin and silicon-based resin by a molding means like compression molding.

Figure 4:
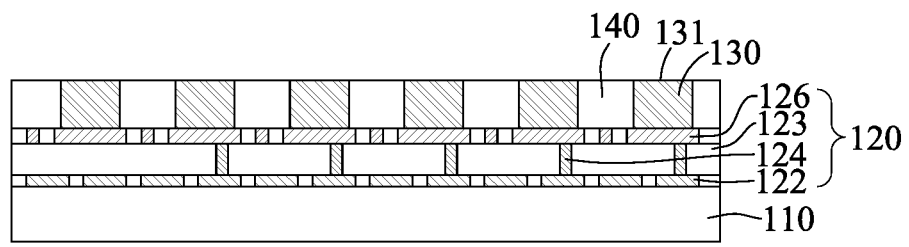

Next, a first dielectric layer 140 is formed on the first carrier 110 while enabling the first dielectric layer 140 to cover the first conductive wire layer 120, surround the first connecting unit 130 and expose one end 131 of the first connecting unit 130, as shown in FIG. 4. The first dielectric layer 140 can be formed of a dielectric material selected from the group consisting of novolac-based resin, epoxy-based resin and silicon-based resin by a molding means like compression molding. Because of the cured or hardened first dielectric layer 140, the package substrate 100 can have a firm structure to build up an electronic device or product. The upper part of the first dielectric layer 140 over the top surface of the first connecting unit 130 can then be removed by polishing or grinding downwards until the end face 131 of the first connecting unit 130 is exposed.

Figure 5:
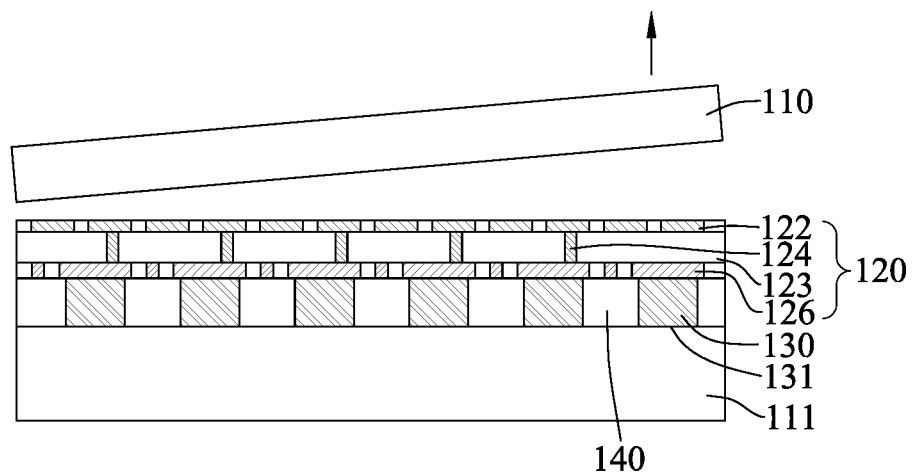

Next, the semi-finished product of FIG. 4 is turned over and then bonded to a second carrier 111, while enabling the top surface of the second carrier 111 to contact the end face 131 of the first connecting unit 130 as shown in FIG. 5. After the first carrier 110 is removed, the first conductive wire layer 120 has its position at the top of the semi-finished product of FIG. 5. The second carrier 111 is then used to carry and support electronic components and conductive wires of the package substrate 100. Similarly, the second carrier 111 can be a metal substrate plate or a dielectric substrate plate coated with a metal layer in a wafer-level or panel-level size, in which the metal can be Fe, Cu, Ni, Sn, Al, Ni/Au or their combination.

Figure 6:
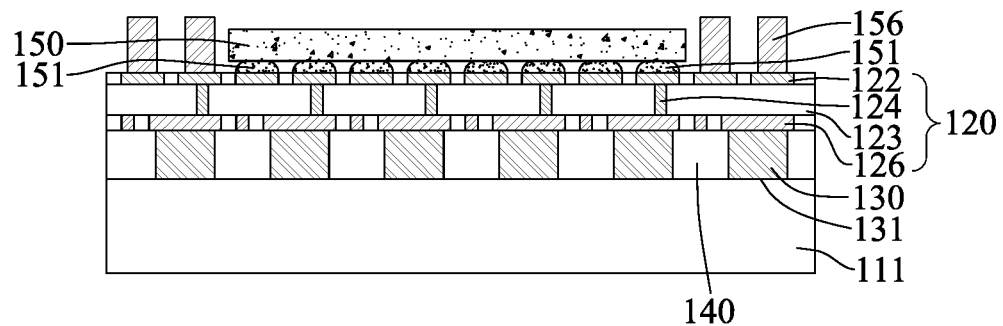

Next, a first circuit chip 150 is disposed and a second connecting unit 156 is formed on the first conductive wire layer 120 as shown in FIG. 6. Depending on practical requirements in the fabrication process, the first circuit chip 150 may be disposed on the first conductive wire layer 120 first, and then the second connecting unit 156 is formed on the first conductive wire layer 120; otherwise, the second connecting unit 156 may be formed on the first conductive wire layer 120 first, and then the first circuit chip 150 is disposed on the first conductive wire layer 120. Both the first circuit chip 150 and the second connecting unit 156 are arranged on the first conductive wire layer 120 and are not vertically overlapped. The first circuit chip 150 may be an active or passive circuit component, which is a die diced from a semiconductor wafer following the IC fabrication process. In the embodiment, the die is provided with eight connection terminals 151 in the form of pin, pad or solder bump, each is connected to one of the metal wires 122. In the embodiment, the first circuit chip 150 is an ASIC like a micro-processor, and the second connecting unit 156 is formed with at least one metal pillar, e.g. copper pillar, which can be formed by electrolytic plating or evaporating a metal layer of Cu, Ni, Sn, Ni/Au or their combination, and then patterning it by means of photolithography.

Figure 7:
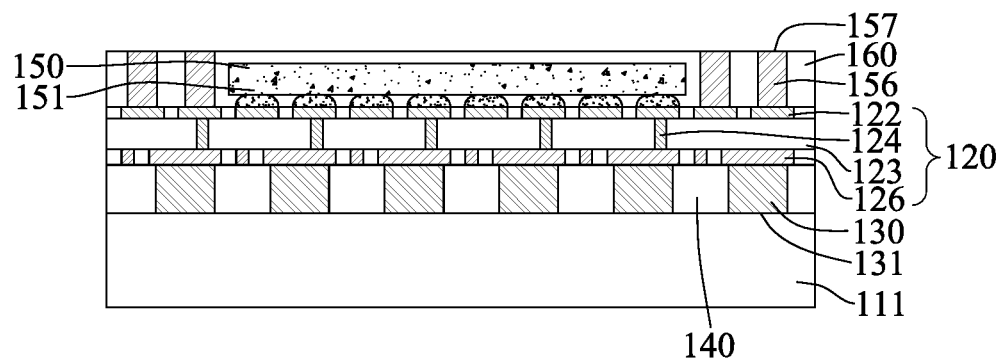

Next, a second dielectric layer 160 is formed on the second carrier 111 while enabling the second dielectric layer 160 to cover the first circuit chip 150 and the second connecting unit 156 and expose one end 157 of the second connecting unit 156, as shown in FIG. 7. The second dielectric layer 160 can be formed of a dielectric material selected from the group consisting of novolac-based resin, epoxy-based resin and silicon-based resin by a molding means like compression molding. But it is not limited thereto; the underfill material with stronger capillarity but more cost can be used to form the second dielectric layer 160. The second dielectric layer 160 covers the first circuit chip 150 and fills up the remainder space of the first package unit other than the first circuit chip 150 and the second connecting unit 156, so that the first package unit is provided with a firm structure after the second dielectric layer 160 is cured or hardened. The upper part of the second dielectric layer 160 over the top surface of the second connecting unit 156 can then be removed by polishing or grinding downwards until the end face 157 of the second connecting unit 156 is exposed.

To construct the second package unit, a second conductive wire layer 170 is then formed on the second dielectric layer 160 while enabling the second conductive wire layer 170 to contact with the end face 157 of the second connecting unit

Figure 8:
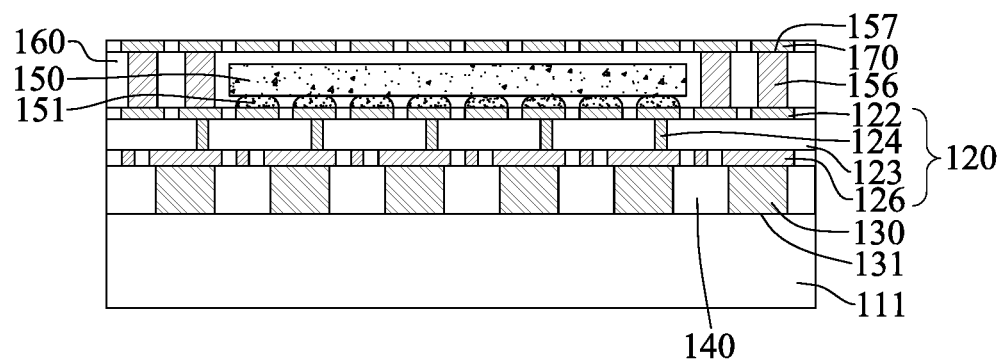

156, as shown in FIG. 8. The second conductive wire layer 170 represents circuitry layout of the second package unit, which can be of single layer or multi-layered structure. In the embodiment, the second conductive wire layer 170 includes at least one metal wire in a single layer. To form the second conductive wire layer 170, a metal layer can be formed of Cu, Al, Ni, or their combination by electrolytic plating or evaporation, and then patterned by means of photolithography.

Figure 9:
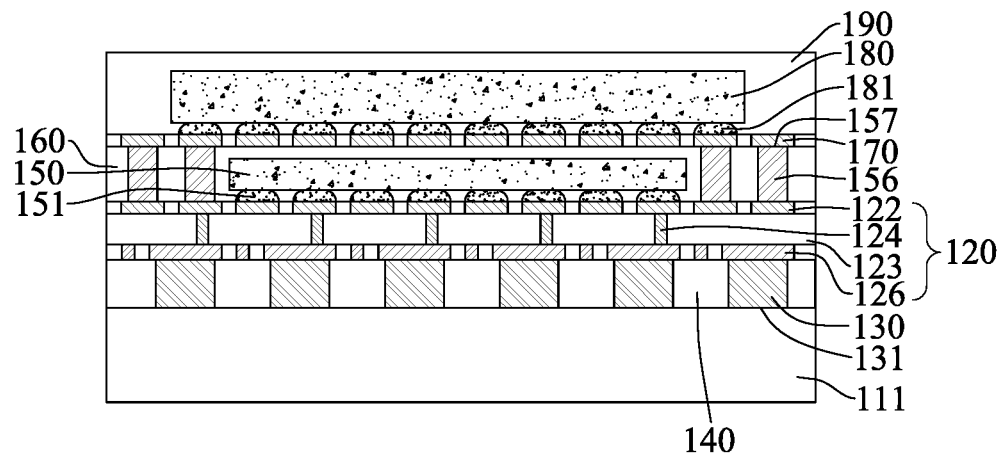

Next, a second circuit chip 180 is disposed on the second conductive wire layer 170 as shown in FIG. 9. The second circuit chip 180 may be an active or passive circuit component, which is a die diced from a semiconductor wafer following the IC fabrication process. In the embodiment, the die is provided with eight connection terminals 181 in the form of pin, pad or solder bump, each is connected to one of the metal wires 170. In the embodiment, the first circuit chip 150 is a memory chip.

Next, a third dielectric layer 190 is formed on the second carrier 111 while enabling the third dielectric layer 190 to cover the second circuit chip 180, as shown in FIG. 9. The third dielectric layer 190 can be formed of a dielectric material selected from the group consisting of novolac-based resin, epoxy-based resin and silicon-based resin by a molding means like compression molding. But it is not limited thereto; the underfill material with stronger capillarity but more cost can be used to form the third dielectric layer 190. The third dielectric layer 190 covers the second circuit chip 180 and fills up the space between the second circuit chip 180 and the second conductive wire layer 170, so that the second package unit is provided with a firm structure after the third dielectric layer 190 is cured or hardened. Moreover, the part of the third dielectric layer 190 over the second circuit chip 180 may act as a protective layer to protect the package substrate 100 from any adverse affect of its surrounding environment or posterior processes such as soldering.

After the second carrier 111 removed, the package substrate 100 of FIG. 1 is obtained. Thus, a large number of package substrates 100 can be concurrently fabricated in the "wafer-level" or "panel-level" process, so as to reduce the average manufacturing cost of an individual package substrate 100.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A method for fabricating a package substrate, comprising steps of:
    (A) providing a first carrier substrate;
    (B) forming a first conductive wire and a first connecting unit on the first carrier substrate;
    (C) forming a first dielectric layer on the first carrier substrate while enabling the first conductive wire and the first connecting unit to be surrounded by the first dielectric layer and an end face of the first connecting unit to be exposed;
    (D) bonding a second carrier substrate to the first dielectric layer and then removing the first carrier substrate;
    (E) disposing a first circuit chip and a second connecting unit on the first conductive wire;
    (F) forming a second dielectric layer on the second carrier substrate while enabling the first circuit chip and the second connecting unit to be surrounded by the second dielectric layer and an end face of the second connecting unit to be exposed;
    (G) forming a second conductive wire on the second dielectric layer;
    (H) disposing a second circuit chip on the second conductive wire;
    (I) forming a third dielectric layer on the second carrier substrate; and
    (J) removing the second carrier substrate.

2. The method of claim 1, wherein the step (B) includes:
    (B11) forming the first conductive wire on the first carrier substrate; and
    (B12) forming the first connecting unit on the first conductive wire.

3. The method of claim 1, wherein the step (C) includes:
    (C11) forming the first dielectric layer on the first carrier substrate while enabling the first conductive wire and the first connecting unit to be covered by the first dielectric layer; and
    (C12) partly removing the first dielectric layer to expose the end face of the first connecting unit.

4. The method of claim 1, wherein the first circuit chip is disposed before the second connecting unit in the step (E).

5. The method of claim 1, wherein the second connecting unit is disposed before the first circuit chip in the step (E).

6. The method of claim 1, wherein the first circuit chip and the second connecting unit are not vertically overlapped in the step (E).

7. The method of claim 1, wherein the second connecting unit is formed by electrolytic plating.

8. The method of claim 1, wherein the second connecting unit includes a metal pillar.

9. The method of claim 1, wherein the step (F) includes:
    (F11) forming the second dielectric layer on the second carrier substrate while enabling the first circuit chip and the second connecting unit to be covered by the second dielectric layer; and
    (F12) partly removing the second dielectric layer to expose the end face of the second connecting unit.

10. The method of claim 1, wherein the second conductive wire is formed on the second dielectric layer while enabling the second conductive wire to be in contact with the exposed end face of the second connecting unit in the step (G).

* * * * *